(12) United States Patent
Brehm et al.

(10) Patent No.: US 7,079,381 B2
(45) Date of Patent: Jul. 18, 2006

(54) SYSTEM AND METHOD FOR ALIGNING AND SUPPORTING INTERCONNECT SYSTEMS

(75) Inventors: George W. Brehm, Holmes, NY (US); Keith E. Barton, Hyde Park, NY (US); John J. Loparco, Poughkeepsie, NY (US); Robert K. Mullady, Highland, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 10/752,969

(22) Filed: Jan. 7, 2004

(65) Prior Publication Data
US 2005/0146855 A1 Jul. 7, 2005

(51) Int. Cl.
*G06F 1/16* (2006.01)

(52) U.S. Cl. ............. 361/685; 361/802; 439/148; 398/79

(58) Field of Classification Search ......... 361/799, 361/801, 802, 807, 809, 679–687, 724–727; 398/79; 439/64, 148, 607–610
See application file for complete search history.

(56) References Cited

U.S. PATENT DOCUMENTS

| | | | |
|---|---|---|---|
| 5,467,254 A | 11/1995 | Brusati et al. ............ 361/799 |
| 5,513,995 A | 5/1996 | Kurotori et al. ............ 439/64 |
| 5,544,008 A * | 8/1996 | Dimmick et al. ........... 361/684 |
| 5,653,596 A | 8/1997 | Banakis et al. ............ 439/64 |
| 6,166,919 A * | 12/2000 | Nicolici et al. ............ 361/800 |
| 6,816,390 B1 * | 11/2004 | Barringer et al. .......... 361/801 |
| 2005/0191056 A1 * | 9/2005 | Coffey ....................... 398/79 |

* cited by examiner

Primary Examiner—Hung Van Duong
(74) Attorney, Agent, or Firm—Floyd Gonzalez; Cantor Colburn LLP

(57) ABSTRACT

An aligning apparatus comprising: a back plane, the back plane comprising at least one back plane connector; at least one daughter card, the daughter card comprising: a lower edge, the lower edge comprising a scalloped surface proximal to a rear surface of the lower edge, and a ramped surface proximal to a front surface of the lower edge; and a daughter card connector, the daughter card connector configured to be removably connectable to the back plane connector; and at least two guide rails extending from the back plane, the guide rail comprising a rear ramp and a front ramp. A method of aligning a daughter card to a back plane, the method comprising: sliding the daughter card towards the back plane; lifting the front end of the daughter; lifting the back end of the daughter card after lifting the front end of the daughter card; and providing the back end of the daughter card with a degree of freedom to lift and lower in order to align to the back plane, after lifting the back end of the daughter card.

17 Claims, 8 Drawing Sheets

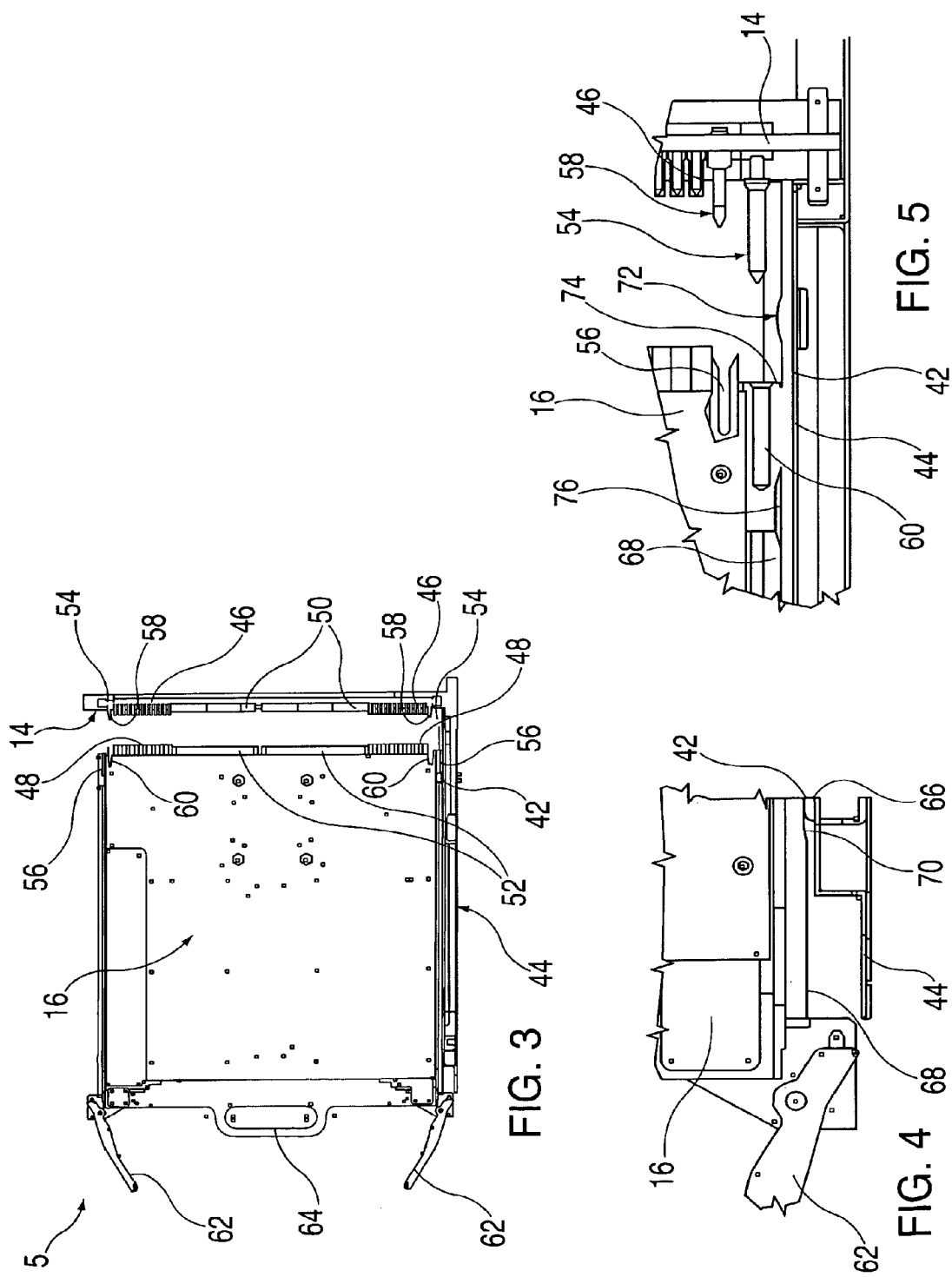

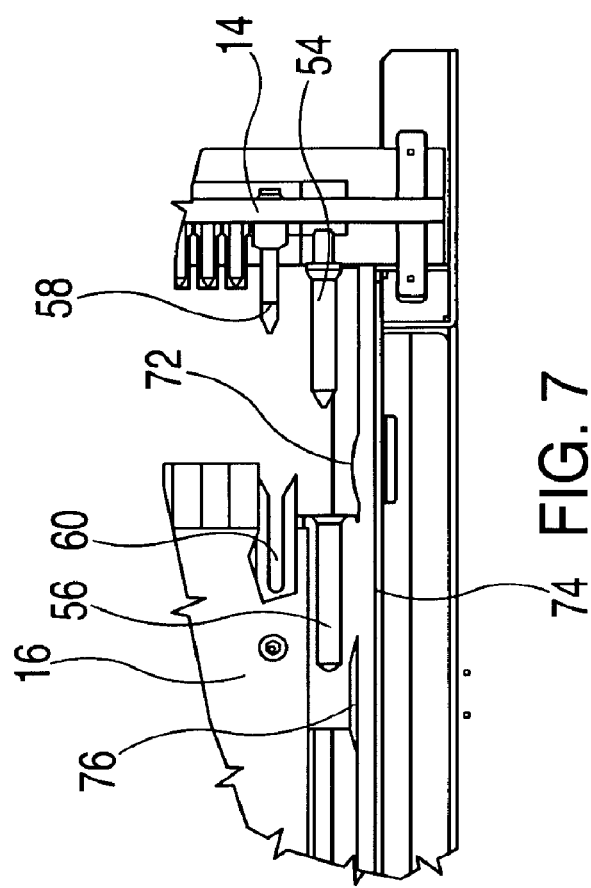
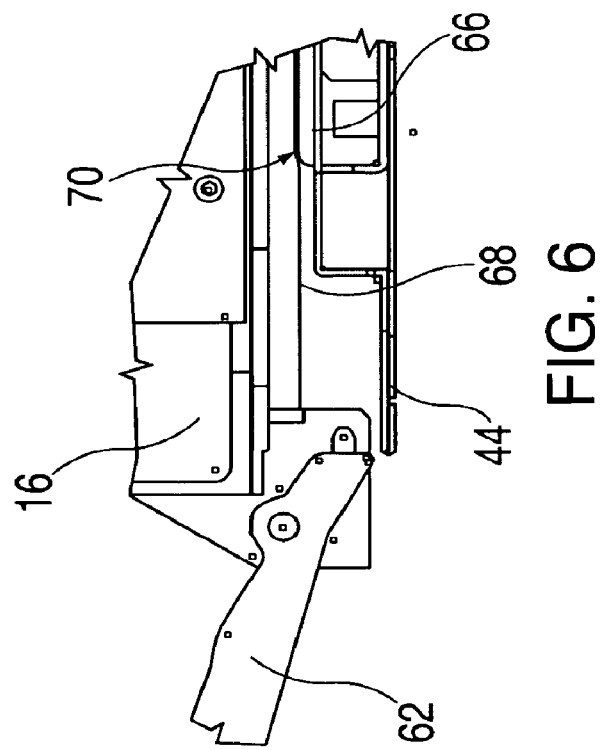
FIG. 7
FIG. 6

SYSTEM AND METHOD FOR ALIGNING AND SUPPORTING INTERCONNECT SYSTEMS

BACKGROUND OF THE INVENTION

Computers are customarily provided with computer cage structures, which may comprise a sheet metal framework and which may contain a back plane. A back plane is a circuit board (e.g., mother card) or framework that supports other circuit boards, devices, and the interconnections among devices, and provides power and data signals to supported devices. The mother card may be the main circuit card in the computer, which may interconnect additional logical cards and assemblies. The computer cage structure is adapted to receive and removably support at least one and preferably a plurality of options or daughter cards (blades or nodes) which when operatively installed in their associated cage structure, upgrade the operating capabilities of the computer. For example, it is known to place an assembly, including a backplane and various circuit boards, such as a processor card, an input-output card and a so-called memory riser card, within an open cage. This forms a so-called central electronics complex (CEC) of a computer system. The cage is subsequently fixed within a computer housing.

A standard containing enclosure or cage protects the mother card and individual daughter cards and facilitates the easy insertion and removal of the daughter cards from a mother card (mother board) or back plane slot. These daughter cards may be installed in the computer during the original manufacture of the computer and or subsequently installed by the computer purchaser. The cage serves to position and mechanically support the circuit boards within the computer housing, and acts as an electromagnetic compatible (EMC) shield. An EMC shield allows operation in an electromagnetic environment at an optimal level of efficiency, and allows static charges to be drained to a frame ground. Moreover, the cage helps to protect the components contained therein from environmental damage, for example, vibrations, which could cause the components to fail.

Additionally, the cage is typically fixed within a so-called system chassis, which is a frame that provides further support for the cage, and which is removably stacked upon other system chassises within a system rack. The chassis may contain other components and sub-systems, such as power supplies and cooling fans, for example, which are connected to the components within the cage using cables, for instance.

A daughter card may include a relatively small rectangular printed circuit having a connecter along one side edge, a 20"×24" node weighing over a hundred pounds, or a server, for example. The mother card or system back plane slot has an electrical connector. The daughter card connector plugs into a corresponding electrical connector of the mother card to operatively couple the daughter card to the mother card or system back plane slot. In order to allow the circuit boards or daughter cards to be connected to the backplane, it is also typical to position the backplane at a middle of the cage, and in a vertical position. This allows the circuit boards or daughter cards to be plugged into the card slots of the backplane through the open front, for example, of the cage.

Data processing systems in general and server-class systems in particular are frequently implemented with a server chassis or cabinet having a plurality of racks. Each cabinet rack can hold a rack mounted device (e.g., a daughter card, also referred to herein as a node, blade or server blade) on which one or more general purpose processors and/or memory devices are attached. The racks are vertically spaced within the cabinet according to an industry standard displacement (the "U"). Cabinets and racks are characterized in terms of this dimension such that, for example, a 42U cabinet is capable of receiving 42 1U rack-mounted devices, 21 2U devices, and so forth. Dense server designs are also becoming available, which allow a server chassis to be inserted into a cabinet rack, thus allowing greater densities than one server per 1U. To achieve these greater densities, the server chassis may provide shared components, such as power supplies, fans, or media access devices which can be shared among all of the blades in the server blade chassis.

Problems have arisen, for example, with the advent of employing daughter cards such as the large massive Processor-Memory cards. Recent system architectures have migrated to using multiples of these large cards (parallel to each other) installed in a vertically orientation and perpendicular to the CEC board. However, inherent in such an architecture are difficulties in insuring that the Processor-Memory card's edge connecters are properly aligned to the mating board's connectors to prevent damaging the interconnect system during installation, such damage includes stubbing. The problem arises from the higher density of the interconnects which requires an accurate alignment between the processor card assembly's connectors and the connectors on the mating surface. Additionally, daughter cards may now exceed 70 lbs in weight, thereby leading to more stubbing.

SUMMARY OF THE INVENTION

The disclosed embodiments relate to an aligning apparatus comprising: a back plane, the back plane comprising at least one back plane connector; at least one daughter card, the daughter card comprising: a lower edge, the lower edge comprising a scalloped surface proximal to a rear surface of the lower edge, and a ramped surface proximal to a front surface of the lower edge; and a daughter card connector, the daughter card connector configured to be removably connectable to the back plane connector; and at least two guide rails extending from the back plane, the guide rail comprising a rear ramp and a front ramp.

In addition, the disclosed embodiments relate to a central electronics complex comprising: an enclosure; a back plane in operable communication to the enclosure, the back plane comprising at least one back plane connector; at least one daughter card, the daughter card comprising: a lower edge, the lower edge comprising a scalloped surface proximal to a rear surface of the lower edge, and a ramped surface proximal to a front surface of the lower edge; and a daughter card connector, the daughter card connector configured to be removably connectable to the back plane connector; and at least two guide rails in operable communication to the enclosure and extending from the back plane, the guide rail comprising a rear ramp and a front ramp.

The disclosed embodiments also relate to a cage structure for a computer comprising: a vertical wall; a back plane in operable communication with the vertical wall, the back plane comprising at least one back plane connector; a horizontal wall, perpendicular and adjacent to the vertical wall; at least two guide rails extending from the vertical wall, and in operable communication to the horizontal wall, the guide rail comprising a rear ramp and a front ramp; and wherein the back plane connector is configured to be removably connectable to at least one daughter card connector.

Additionally, the disclosed embodiments relate to a method of aligning a daughter card to a back plane, the method comprising: sliding the daughter card towards the back plane; lifting the front end of the daughter; lifting the back end of the daughter card after lifting the front end of the daughter card; and providing the back end of the daughter card with a degree of freedom to lift and lower in order to align to the back plane, after lifting the back end of the daughter card.

BRIEF DESCRIPTION OF THE DRAWINGS

Referring now to the exemplary drawings wherein like elements are numbered alike in the several FIGURES:

FIG. 3 is a side view of the disclosed aligning apparatus in about an 88% inserted position;

FIG. 4 is a close up view of the lower left corner of the disclosed aligning apparatus of FIG. 3;

FIG. 5 is a close up view of the lower right corner of the disclosed aligning apparatus of FIG. 3;

FIG. 6 is a close up view of the lower left corner of the disclosed aligning apparatus in about a 90% inserted position;

FIG. 7 is a close up view of the lower right corner of the disclosed aligning apparatus in about a 90% inserted position;

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis.

Figure 1:
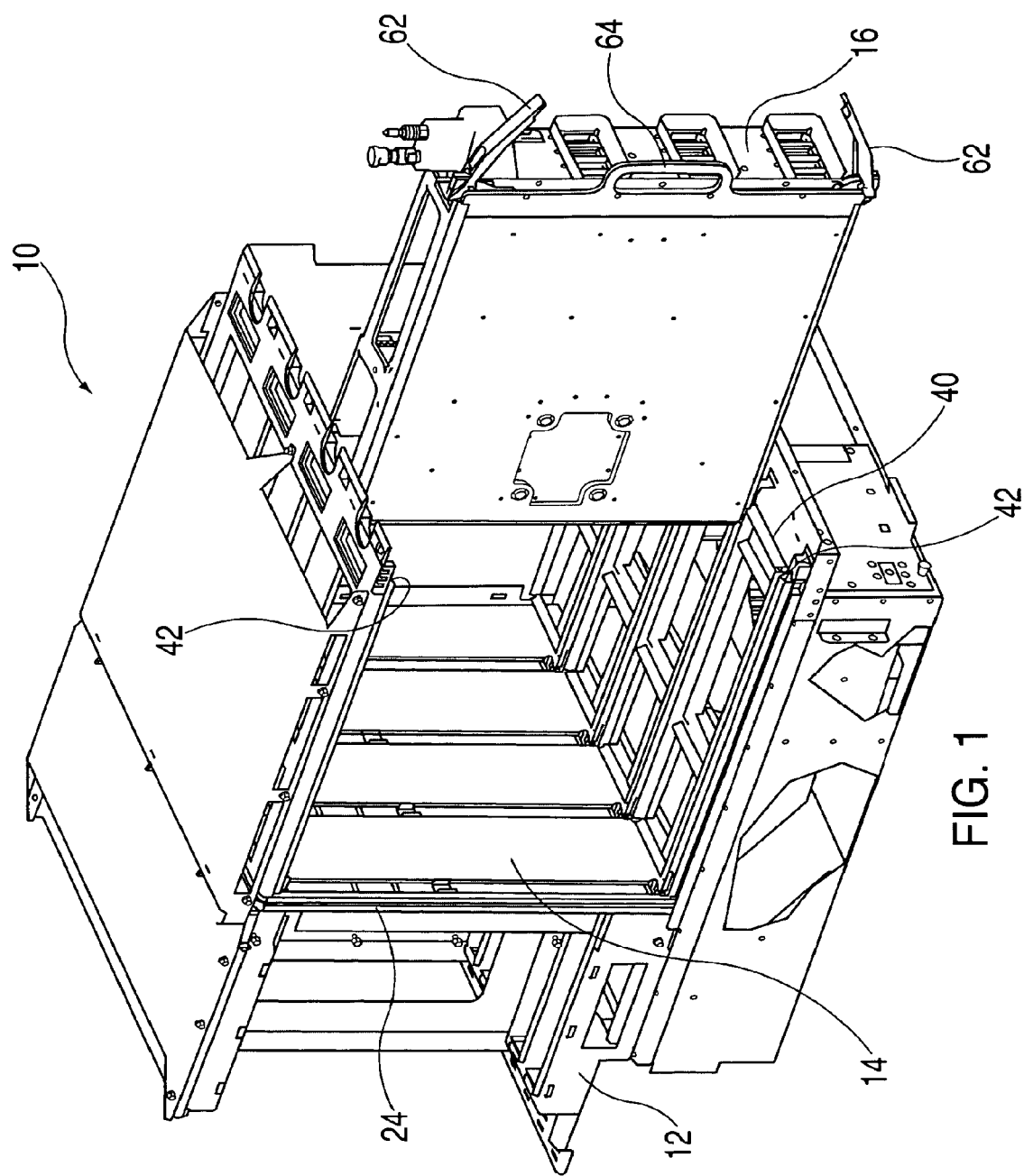
FIG. 1 is a perspective view of a multiple card enclosure illustrating one daughter card enclosure interfacing with a back plane.
Figure 2:
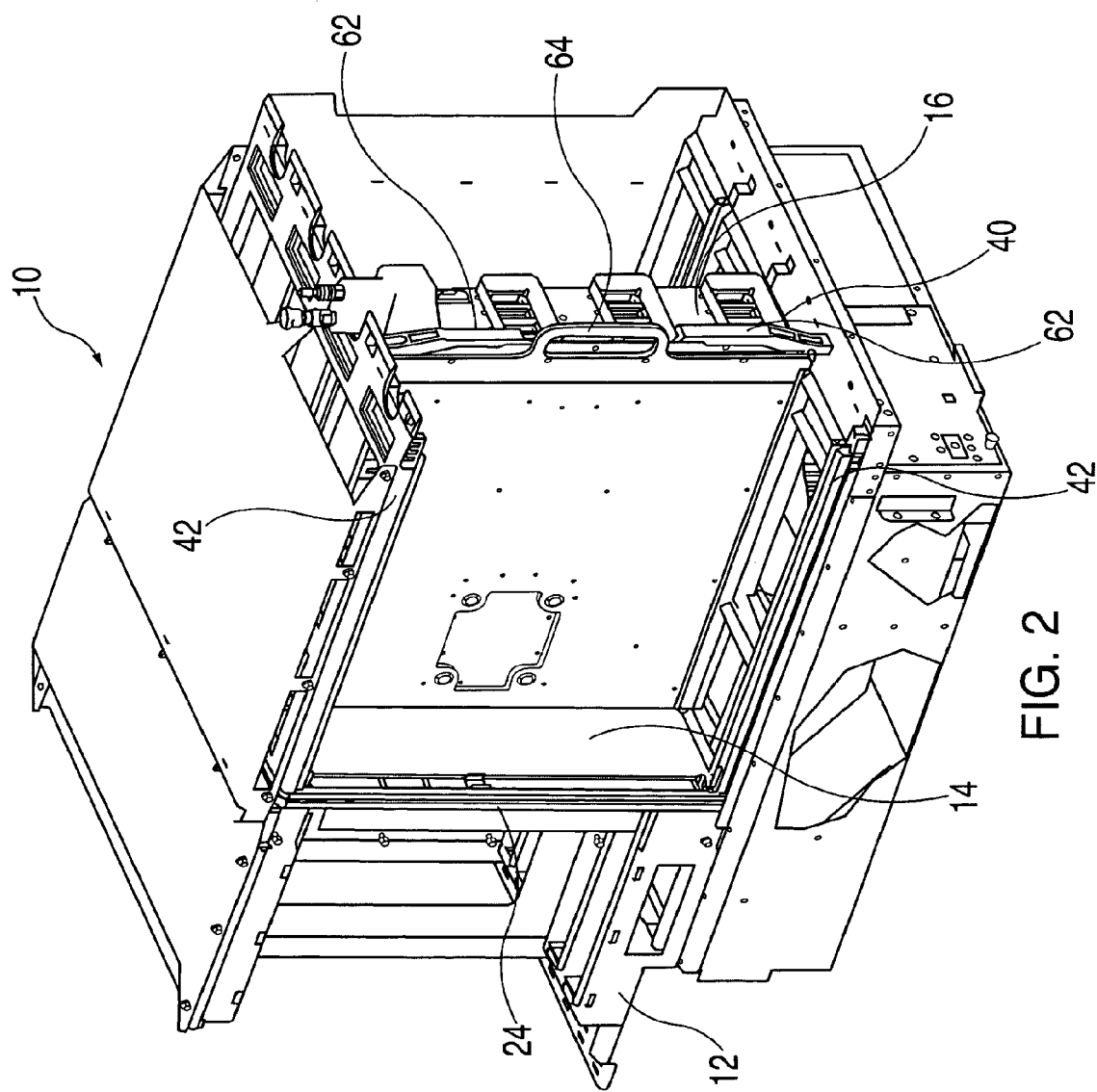
FIG. 2 is a perspective view of the multiple card enclosure of FIG. 1 with a stiffener removed therefrom.

FIGS. 1 and 2 illustrate an exemplary embodiment of the invention, which includes a so-called central electronics complex 10 (CEC) of a computer system. The CEC 10 is comprised of an enclosure (such as a cage 12), a backplane or midplane 14 as illustrated, and a circuit board or daughter card, generally known as a blade or node, and may be more specifically a processor card assembly 16.

The cage 12 is dimensioned to accommodate the back plane 14 and a plurality of daughter cards 16. Moreover, the cage 12 is preferably comprised of sheet metal, which can be easily manipulated to form the walls of the cage 12, although other materials, such as plastic, may also be used. However, it is preferable that the material used to form the cage 12 be conductive, so that the cage can serve as an EMC shield.

As best shown with reference to both FIG. 1 and FIG. 2, the backplane or midplane 14 is a generally planar, rectangular structure, and is accommodated within the cage 12 so that its major surfaces are substantially vertical and essentially perpendicular to the walls of the cage.

Each daughter card 16 are generally planar, rectangular structures, with lengths that are substantially the same as their heights, as illustrated, but not limited thereto. As previously mentioned, the cage 12 can then be advantageously tailored in the same manner (with a length that is about the same as its height), so as to receive the respective cards 16 therein with a minimum amount of wasted space.

When installed in the cage 12, the cards 16 are essentially parallel to each other, and essentially perpendicular to the major surfaces of the backplane 14. However, other orientations may be possible, within the scope of the present invention.

The daughter card 16 is preferably removably coupled to the backplane 14 by inserting a known corresponding plug connector, such as a single row or a dual row of full edge length very high density metric interconnector (VHDM) (46, 48, 50, 52 not shown detail FIGS. 1 and 2, but shown in FIG. 3) on the respective card into an associated backplane card slot 40 (FIG. 2). However, other suitably configured plug connectors are contemplated and are not limited to a VHDM. As will be appreciated, since the cage 12 is open at its front, each card 16 is inserted through the open front and moved in a horizontal vertical direction until the cards engage with associated card slots 40 and power interconnects to be discussed more fully below.

As illustrated in FIGS. 1 and 2, the back plane 14 is adapted to receive and electrically interconnect a plurality of daughter cards 16. For example, the illustrated back plane 14 is adapted to receive four cards 16.

Although the present embodiment has been described in connection with a daughter card 16 such as a processor card assembly, it is contemplated that the same inventive scheme can be utilized with other types of circuit boards. Moreover, it is also contemplated that the respective cards may be specifically tailored for use with the cage 12. For example, in the above-described exemplary embodiment, the plug connector of the daughter card is disposed symmetrically, that is, along a full length of the edge of the card.

As will be appreciated, since the cards 16 may be modified by the user, it is advantageous if the cards be easily accessible. As previously discussed, each card is accessed through the open front of the cage 12. Conventionally, the cages are each positioned within a respective chassis, each having an open top, with the respective chassies and cages being stacked upon each other. As such, in order to access a cage within a lower positioned chassis, it had conventionally been necessary to remove the associated chassis from a rack.

As shown in FIGS. 1 and 2, in order to facilitate the installation and removal of the card 16 from the cage 12, the card is advantageously slidably disposed on at least two guide rails 42 which may be operably connected to wall 24 of cage 12 in an upper and lower configuration, for example, and registered to back plane 14. Thus, when it is desired to install a card 16, the card 16 is simply slid in a horizontal direction into cage 12. The daughter card 16 may have at least one latch 62 and one handle 64. The latch 62 may be configured to lock the daughter card 16 into place once the daughter card is in operable communication with the back plane 14. The handle 64 may be configured to allow easier installation for large and massive daughter cards 16, for example some processor card assemblies may weigh in excess of 70 pounds.

Referring now to FIG. 3, an aligning apparatus 5 is shown in a side view. The aligning apparatus 5 comprises a daughter card 16 adjacent to a back plane 14, which may also be a mother card, or mid plane. In this figure, and in FIGS. 4 and 5, the daughter card 16 is shown about 88% inserted into the back plane 14. Extending from the back plane 14 is the guide rail 42. The guide rail may comprise a non-conductive material such as plastic. In addition, the guide rail may also comprise surface treated metals, such as nickel-plated steels for instance. The guide rail 42 assists in guiding and aligning the daughter card 16 to the back plane 14. Below the guide rail is a sheet metal guide 44. The mother card 14 may have at least one VHDM power module 46 which is connectable to at least one VHDM power connector 48 located on the daughter card 16. The mother card 14 may also have at least one VHDM signal connector 50 located on the back plane 14 which is connectable to at least one VHDM signal wafer 52 located on the daughter card 16. The back plane may also have at least two support pins 54 which is engagable to at least two support pin holes 56 located on the daughter card, the at least two support pins 54 and at least two support pin holes 56 may be arranged in an upper and lower configuration. Additionally, the back plane may have at least two guide pins 58 which is engageable with at least two guide pin holes 60 located on the daughter card 16, the at least two guide pins 58 and at least two guide pin holes 60 may be arranged in an upper and lower configuration. The guide pins 58 allow for fine alignment of a daughter card 16 to the mother card 14. However, if the daughter card is very heavy, on the order of 70 lbs, the guide pins 58 will not able to provide proper alignment function. The support pins 54 are large enough to assist in supporting the weight of very heavy daughter cards 16, and will allow the guide pins 58 to support the dynamics of the docking action when the daughter card 16 is being docked onto the mother card 14. In the configuration shown in FIG. 3, the front end of the daughter card is on the left side of the daughter card 16, and the rear end of the daughter card 16 is on the right side.

FIG. 4 shows a close up partial view of the lower left corner of the aligning apparatus 5. Adjacent to the sheet metal guide 44 is the guide rail 42. The portion of the guide rail 42 shown in FIG. 4 is a front lifting ramp 66. The daughter card 16 has a lower edge 68. On the lower edge 68 is a ramped surface 70. As the daughter card is inserted into the back plane to the right (not shown), the lower edge 68 of the daughter card 16 rests on the guide rail 42 and moves to the right relative to the guide rail 42. When the ramped surface 70 comes into contact with the front lifting ramp 66, the front end of the daughter card 16 is lifted. This lifting is done to compensate for lifting that will take place at the rear of the daughter card 16 as the daughter card 16 continues to be inserted.

FIG. 5 shows a close up partial view of the lower right corner of the aligning apparatus 5. Again, the sheet metal guide 44 is shown adjacent to a guide rail 42. In this view a rear lifting ramp 72 is shown. The lower edge 68 may comprise a rear surface 74 and a scalloped surface 76 adjacent to the rear surface. The interaction of the rear surface 74 and scalloped surface 76 with the rear lifting ramp will be shown in FIGS. 7, 9, 10, 11 and 12, below. Still referring to FIG. 5, a support pin 54 in the back plane 14 and support pin hole 56 in the daughter card 16 are shown prior to engagement with each other. Similarly a guide pin 58 in the back plane 14 and a guide pin hole 60 in the daughter card 16 are shown prior to engagement with each other as well.

FIG. 6 shows a close up partial view of the lower left corner of the aligning apparatus 5 where the daughter card 16 is about 90% inserted into the back plane 14. The ramped surface 70 of the lower edge 68 is shown now in the middle of being lifted onto the front lifting ramp 66, thereby raising the front end of the daughter card 16.

FIG. 7 shows a close up partial view of the lower right corner of the aligning apparatus 5, and similarly to FIG. 6, the daughter card 16 is about 90% inserted into the back plane 14. In this figure it can be seen that as the daughter card 16 is being moved to the right in order to connect to the back plane 14, the rear surface 74 is approaching the rear lifting ramp 72, whereupon the rear end of the daughter card 16 will be lifted prior to the pins 54,58 engaging with the pin holes 56,60, respectively.

Figure 8:
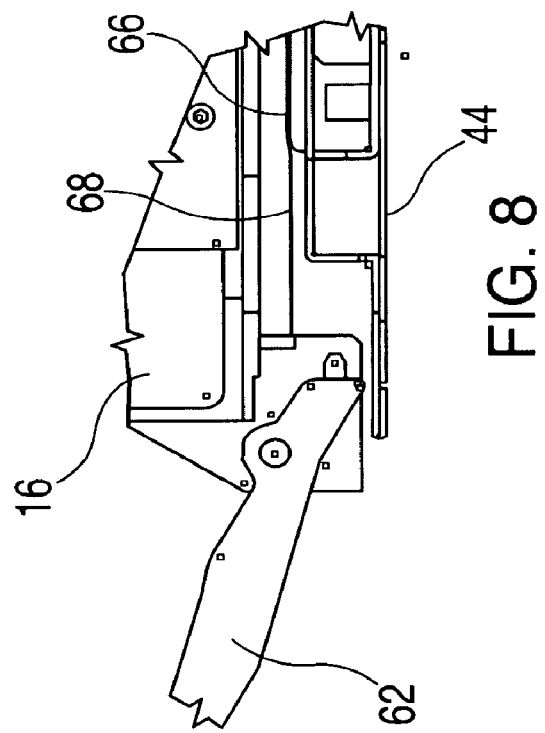
FIG. 8 is a close up view of the lower left corner of the disclosed aligning apparatus in about a 93% inserted position.

FIG. 8 shows a close up partial view of the lower left corner of the aligning apparatus 5 where the daughter card 16 is about 93% inserted into the back plane 14. At this point, the lower edge 68 is fully lifted onto the front lifting ramp 66. In some configurations, the amount of lift at this point may be about 1 mm.

Figure 9:
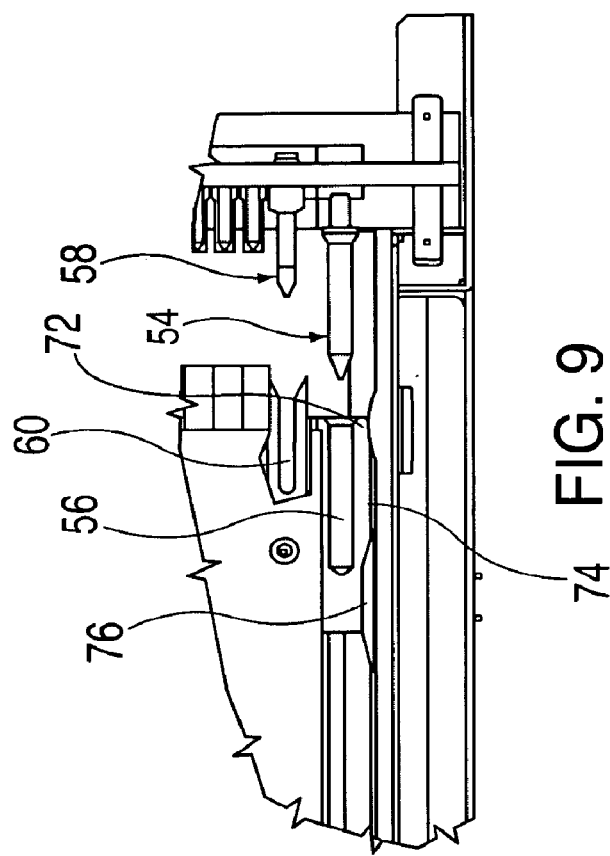
FIG. 9 is a close up view of the lower right corner of the disclosed aligning apparatus in about a 93% inserted position.

FIG. 9 shows a close up partial view of the lower right corner of the aligning apparatus 5, and similarly to FIG. 8, the daughter card 16 is about 93% inserted into the back plane 14. It can be seen that the rear surface 74 is beginning to be lifted by the rear lifting ramp 72 as the daughter card 16 is moved to the right.

Figure 10:
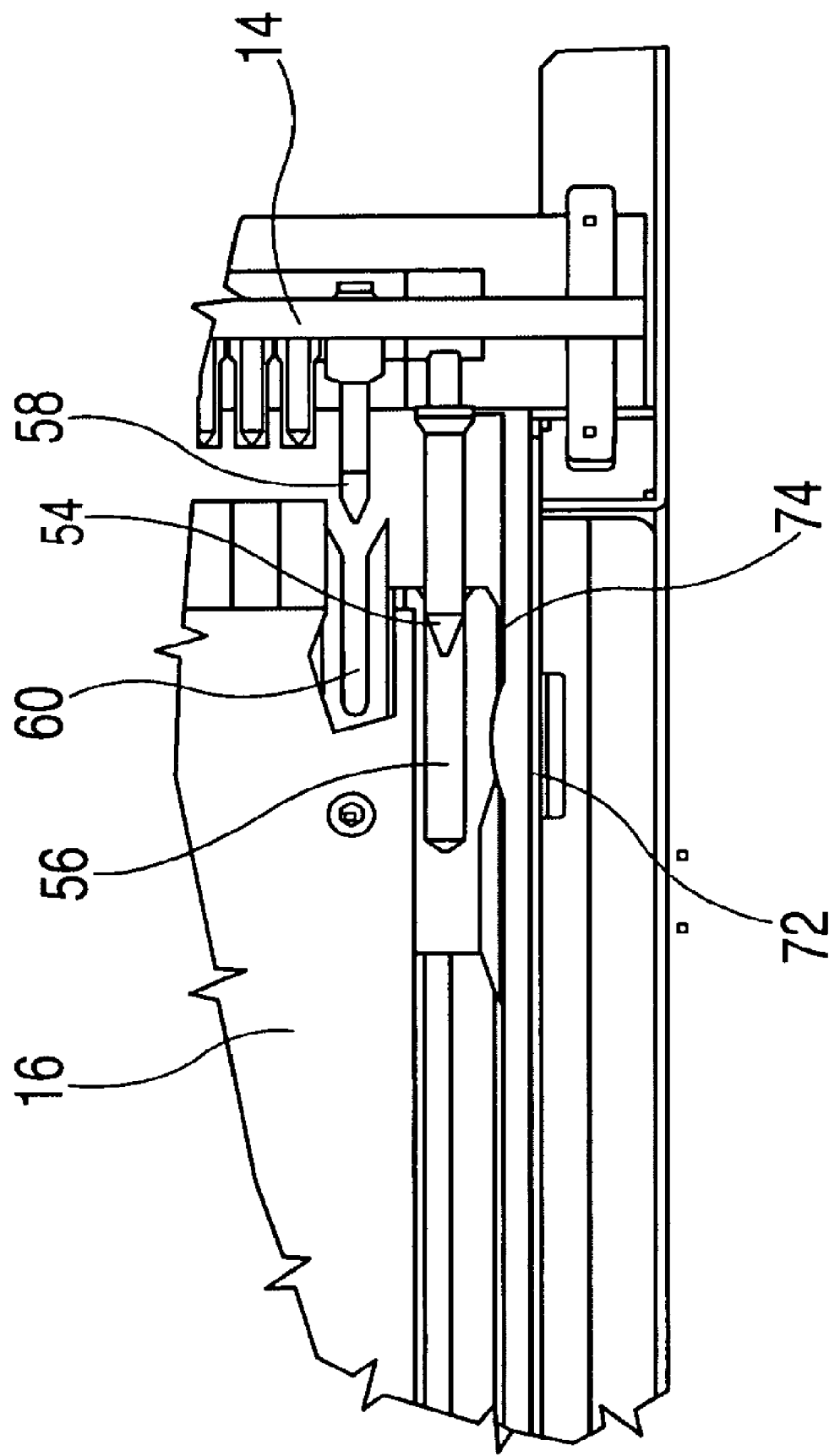
FIG. 10 is a close up view of the lower right corner of the disclosed aligning apparatus in about a 95% inserted position.

FIG. 10 shows a close up partial view of the lower right corner of the aligning apparatus 5, where the daughter card 16 is about 95% inserted into the back plane 14. It can be seen that the rear surface 74 is fully lifted by rear lifting ramp 72 as the daughter card 16 continues to move to the right. The support pin 54 is shown engaging with the support pin hole 56 well before the guide pin 58 engages with the guide pin hole 60.

Figure 11:
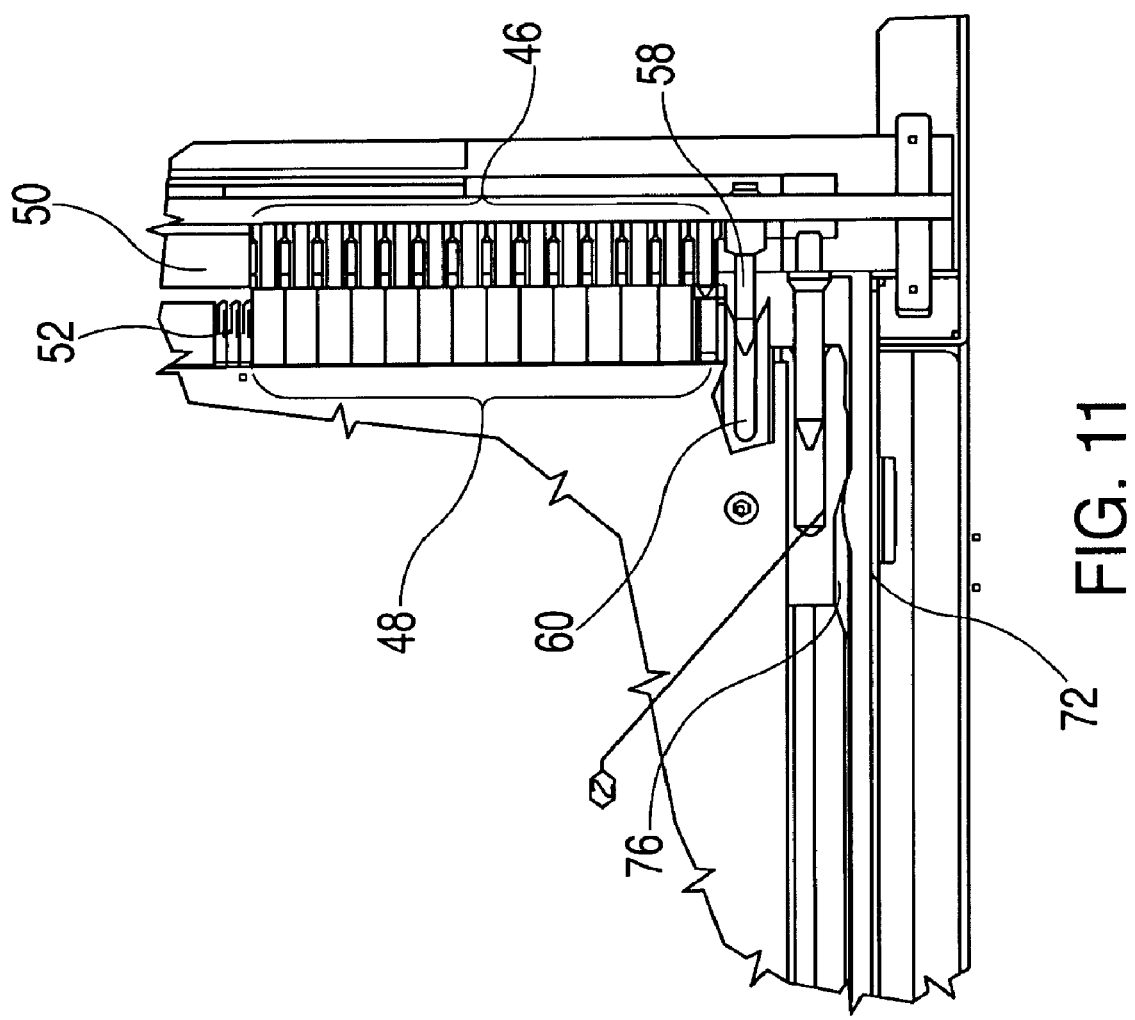
FIG. 11 is a close up view of the lower right corner of the disclosed aligning apparatus in about a 98% inserted position.

FIG. 11 shows a close up partial view of the lower right corner of the aligning apparatus 5, where the daughter card 16 is about 98% inserted into the back plane 14. It can be seen that the scalloped surface 76 is becoming proximal to the rear lifting ramp 72. As the scalloped surface becomes closer to the rear lifting ramp 72, the ramp 72 begins to "fit" into the scalloped surface, and therefore begins to allow the lower edge 68 to have the freedom to move down. At this point, the guide pin 58 is engaging with the guide pin hole 60. At this point the VHDM power modules 46 on the back plane 14 begin to engage with the VHDM power connectors 48 on the daughter card 16. This occurs prior to the VHDM signal wafers 52 on the daughter card engaging with the VHDM signal connectors 50 on the back plane 14.

Figure 12:
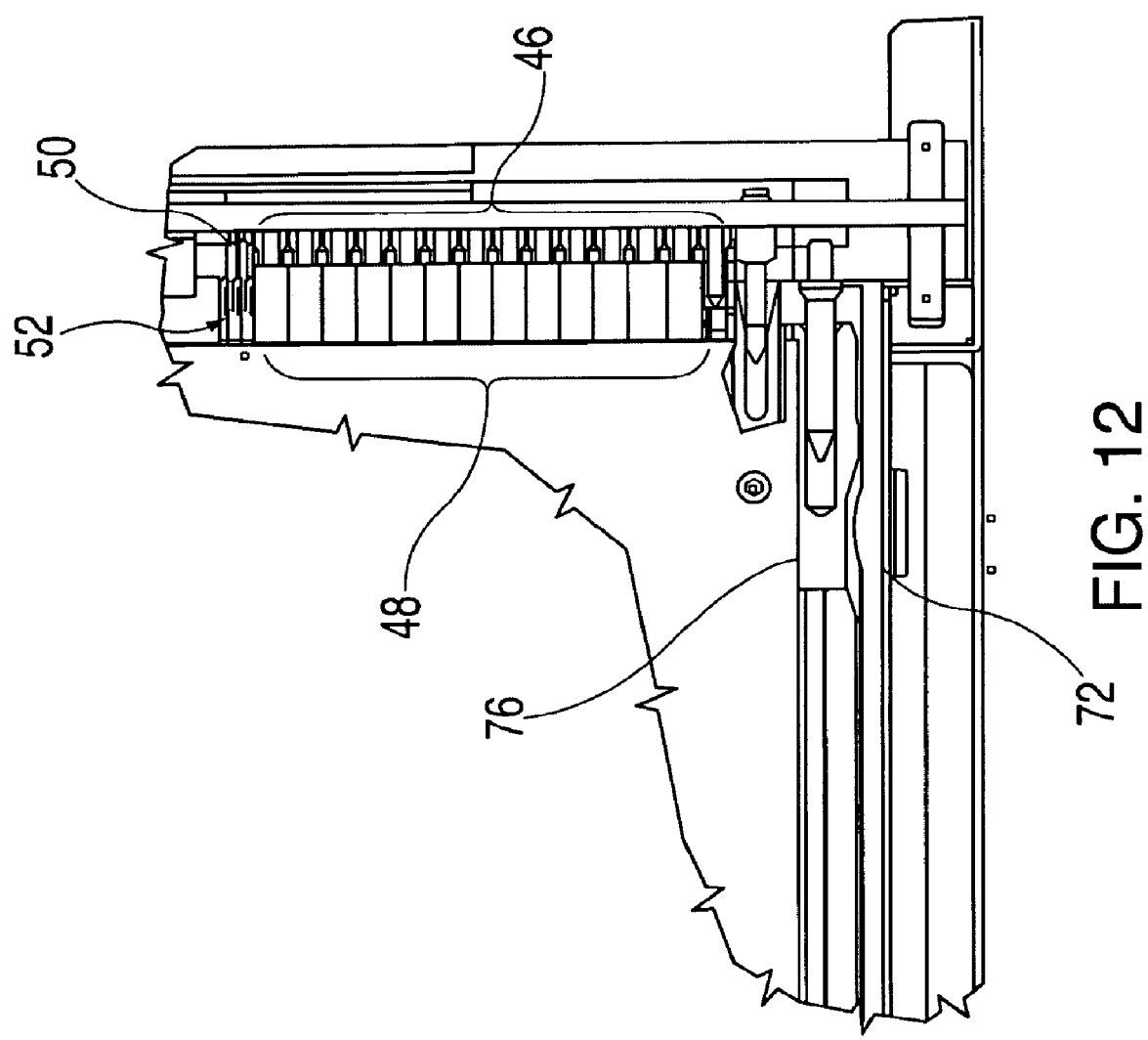
FIG. 12 is a close up view of the lower right corner of the disclosed aligning apparatus in about a 99% inserted position.

FIG. 12 shows a close up partial view of the lower right corner of the aligning apparatus 5, where the daughter card 16 is about 99% inserted into the back plane 14. It can be seen that the scalloped surface 76 now allows the rear lifting ramp 72 to move into the space defined by the scalloped surface 76, thereby providing a degree of freedom for the mating surfaces of the daughter card 16 and back plane 14 to find the alignment features of the interconnectors, these alignment features being well known in the art. Once fully inserted, the daughter card 16 makes contact with the sheet metal guides 44 and may be bolted into place with fasteners.

The disclosed apparatus describes the use of front and rear lifting ramps and guide pins to support a daughter card's mass. In addition, the disclosed apparatus will properly align the electronic connector's inherent mating features prior to final docking. The electronic connectors include VHDM. The disclosed apparatus will reduce the incidences of connector stubbing.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An aligning apparatus comprising:
a back plane, the back plane comprising at least one back plane connector;
at least one daughter card, the daughter card comprising:
a lower edge, the lower edge comprising a scalloped surface proximal to a rear surface of the lower edge, and a ramped surface proximal to a front surface of the lower edge; and
a daughter card connector, the daughter card connector configured to be removably connectable to the back plane connector; and
at least two guide rails extending from the back plane, the guide rail comprising a rear ramp and a front ramp.

2. The aligning apparatus of claim 1, wherein the front ramp is configured to lift a front end of the daughter card via the ramped surface of the lower edge as the daughter card begins to be inserted into the back plane, and the rear ramp is configured to subsequently lift a rear end of the daughter card via the rear surface of the lower edge as the daughter card continues to be inserted, and the rear ramp is further configured to fall away into the scalloped surface of the lower edge as the daughter card still continues to be inserted, allowing a degree of freedom for aligning the daughter card connector to the back plane connector.

3. The aligning apparatus of claim 1, wherein:
the back plane further comprises at least two support pins located on a mating surface of the back plane, and at least two guide pins located on the mating surface of the back plane; and
the daughter card further comprises at least two support pin holes located on a mating surface of the daughter card, and at least two guide pin holes located on the mating surface of the daughter card.

4. The aligning apparatus of claim 3, wherein the support pin is configured to engage with the support pin hole prior to the guide pin engaging with the guide pin hole.

5. The aligning apparatus of claim 3, wherein the back plane connector and daughter card connector are very high density metric interconnectors.

6. The aligning apparatus of claim 3, wherein the daughter card is a processor card assembly.

7. The aligning apparatus of claim 3, further comprising:
a plurality of guide rails extending from the back plane, each of the guide rails comprising a rear ramp and a front ramp;
a plurality of daughter cards, each of the daughter cards comprising:
a lower edge, the lower edge comprising a scalloped surface proximal to a rear surface of the lower edge, and a ramped surface proximal to a front surface of the lower edge; and
wherein each of the plurality of daughter cards are configured to slide along one of the plurality of guide rails and be inserted into the back plane.

8. A central electronics complex comprising:
an enclosure;
a back plane in operable communication to the enclosure, the back plane comprising at least one back plane connector;
at least one daughter card, the daughter card comprising:
a lower edge, the lower edge comprising a scalloped surface proximal to a rear surface of the lower edge, and a ramped surface proximal to a front surface of the lower edge; and
a daughter card connector, the daughter card connector configured to be removably connectable to the back plane connector; and
at least two guide rails in operable communication to the enclosure and extending from the back plane, the guide rail comprising a rear ramp and a front ramp.

9. The central electronics complex of claim 8, wherein the front ramp is configured to lift a front end of the daughter card via the ramped surface of the lower edge as the daughter card begins to be inserted into the back plane, and the rear ramp is configured to subsequently lift a rear end of the daughter card via the rear surface of the lower edge as the daughter card continues to be inserted, and the rear ramp is further configured to fall away into the scalloped surface of the lower edge as the daughter card still continues to be inserted, allowing a degree of freedom for aligning the daughter card connector to the back plane connector.

10. The central electronics complex of claim 8, wherein:
the back plane further comprises at least two support pins located on a mating surface of the back plane, and at least two guide pins located on the mating surface of the back plane; and
the daughter card further comprises at least two support pin holes located on a mating surface of the daughter card, and at least two guide pin holes located on the mating surface of the daughter card.

11. The central electronics complex of claim 10, wherein the support pin is configured to engage with the support pin hole prior to the guide pin engaging with the guide pin hole.

12. A cage structure for a computer comprising:
a vertical wall;
a back plane in operable communication with the vertical wall, the back plane comprising at least one back plane connector;
a horizontal wall, perpendicular and adjacent to the vertical wall;
at least two guide rails extending from the vertical wall, and in operable communication to the horizontal wall, the guide rail comprising a rear ramp and a front ramp; and
wherein the back plane connector is configured to be removably connectable to at least one daughter card connector.

13. The cage structure of claim 12, wherein:
the back plane further comprises at least two support pins located on a mating surface of the back plane, and at least two guide pins located on the mating surface of the back plane.

14. The cage structure of claim 13, wherein the support pin is configured to engage with a support pin hole prior to the guide pin engaging a the guide pin hole.

15. A cage structure for a computer comprising:
a vertical wall;
a back plane in operable communication with the vertical wall, the back plane comprising at least one back plane connector;

a horizontal wall, perpendicular and adjacent to the vertical wall;
at least two guide rails extending from the vertical wall, and in operable communication to the horizontal wall, the guide rail comprising a rear ramp and a front ramp;
wherein the back plane connector is configured to be removably connectable to at least one daughter card connector; and
wherein the front ramp is configured to lift a front end of a daughter card via a ramped surface of a lower edge of the daughter card, as the daughter card begins to be inserted into the cage structure, and the rear ramp is configured to subsequently lift a rear end of the daughter card via a rear surface of the lower edge of the daughter card, as the daughter card continues to be inserted, and the rear ramp is further configured to fall away into a scalloped surface of the lower edge of the daughter card as the daughter card still continues to be inserted, allowing a degree of freedom for aligning a daughter card connector to the back plane connector.

16. A method of an aligning a daughter card to a back plane, the method comprising:
sliding the daughter card towards the back plane;
lifting the front end of the daughter;
lifting the back end of the daughter card after lifting the front end of the daughter card; and
providing the back end of the daughter card with a degree of freedom to lift and lower in order to align to the back plane, after lifting the back end of the daughter card.

17. The method of claim 16, further comprising:
engaging at least two support pins with at least two support pin holes; and
engaging at least two guide pins with at least two guide pin holes after the support pin and support pin hole begin to engage.

* * * * *